US011380744B2

(12) United States Patent
Ni et al.

(10) Patent No.: US 11,380,744 B2
(45) Date of Patent: Jul. 5, 2022

(54) DISPLAY PANEL AND DISPLAY DEVICE WITH A THIN FILM ENCAPSULATION LAYER

(71) Applicant: BOE Technology Group Co., Ltd., Beijing (CN)

(72) Inventors: Jingkai Ni, Beijing (CN); Xiaofen Wang, Beijing (CN); Xiang Zhou, Beijing (CN); Huili Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 66 days.

(21) Appl. No.: 16/897,624

(22) Filed: Jun. 10, 2020

(65) Prior Publication Data

US 2021/0036074 A1    Feb. 4, 2021

(30) Foreign Application Priority Data

Aug. 2, 2019 (CN) .......................... 201910713779.4

(51) Int. Cl.
*H01L 27/32* (2006.01)
*H01L 51/52* (2006.01)

(52) U.S. Cl.
CPC ...... *H01L 27/3246* (2013.01); *H01L 51/5237* (2013.01); *H01L 2251/5338* (2013.01)

(58) Field of Classification Search
CPC .......................... H01L 27/3246; H01L 51/5237
USPC ........................................................ 257/40
See application file for complete search history.

(56) References Cited

U.S. PATENT DOCUMENTS

2018/0366682 A1* 12/2018 Kang ................. H01L 27/3262
2020/0152720 A1*  5/2020 Zhang ................ H01L 27/3246

FOREIGN PATENT DOCUMENTS

| CN | 103311269 A | 9/2013 |
| CN | 108511505 A | 9/2018 |
| CN | 109065596 A | 12/2018 |
| CN | 109119550 A | 1/2019 |
| CN | 109166882 A | 1/2019 |
| CN | 109671738 A | 4/2019 |

OTHER PUBLICATIONS

Zhu et al., Chinese and English translation of CN109166882A. (Year: 2019).*
Office Action dated Apr. 21, 2021 issued in corresponding Chinese Application No. 201910713779.4.

* cited by examiner

*Primary Examiner* — Xia L Cross
(74) *Attorney, Agent, or Firm* — Nath, Goldberg & Meyer; Joshua B. Goldberg

(57) ABSTRACT

Embodiments of the present disclosure provided a display panel and a display device. The display panel includes a plurality of pixel defining units, each of the plurality of pixel defining units has a pixel hole for arranging a sub-pixel, and a first guide groove section connecting to the pixel hole, and the first guide groove sections corresponding to two adjacent pixel defining units are connected to each other to form a first guide groove.

8 Claims, 4 Drawing Sheets

DISPLAY PANEL AND DISPLAY DEVICE WITH A THIN FILM ENCAPSULATION LAYER

CROSS-REFERENCE TO RELATED APPLICATION

The present application claims priority from Chinese patent application No. 201910713779.4 filed with China National Intellectual Property Administration (CNIPA) on Aug. 2, 2019, the disclosure of which is incorporated herein by reference.

TECHNICAL FIELD

The present application relates to the technical field of display technologies, and particularly relates to a display panel and a display device.

BACKGROUND

The development form and application directions of the flexible display screen generally follow the trends of being bendable, foldable, rollable and the like, and thickness of the flexible display screen can directly influence these mechanical properties of the flexible display screen. Therefore, reducing thickness of the product is imperative.

However, as the demand on definition of the flexible display screen becomes higher and higher and the pixels become denser and denser, the openings in the pixel defining structure correspondingly become smaller and denser, which increases the difficulty in levelling the liquid membrane material as well as the required amount of the liquid membrane material, thereby deviating from the object of reducing thickness of the overall device and further away from a lightweight product.

SUMMARY

In a first aspect of the present application, an embodiment of the present application provides a display panel including a plurality of pixel defining units, each of the plurality of pixel defining units has a pixel hole for arranging a sub-pixel, and a first guide groove section connecting to the pixel hole, and the first guide groove sections corresponding to two adjacent pixel defining units are connected to each other to form a first guide groove.

In a second aspect, an embodiment of the present application provides a display device including the display panel and a thin film encapsulation layer arranged above the display panel.

The technical solution provided in the embodiments of the present application has the following beneficial technical effects: the pixel defining structure of the flexible display screen is improved by adding a guide groove in communication with the pixel hole so that the encapsulation operation can happen only in the pixel hole and the guide groove, which ensures that the levelling height is reduced under the premise that the liquid membrane material forming the TFE is sufficiently spread and levelled, thereby reducing the thickness of the TFE and thus the flexible display screen, and levelling of the liquid membrane material is guided with the guide groove so that the levelling direction is clear and definite, thereby improving the levelling efficiency and reducing consumption of the liquid membrane material and thus the cost.

Additional aspects and advantages of the present application will be set forth in part and become apparent in the description below, or may be learned by practice of the present application.

BRIEF DESCRIPTION OF THE DRAWINGS

The above and/or additional aspects and advantages of the present application will become apparent and readily understood from the description of embodiments with reference to the drawings below, in which.

DETAILED DESCRIPTION OF THE EMBODIMENTS

Figure 1:
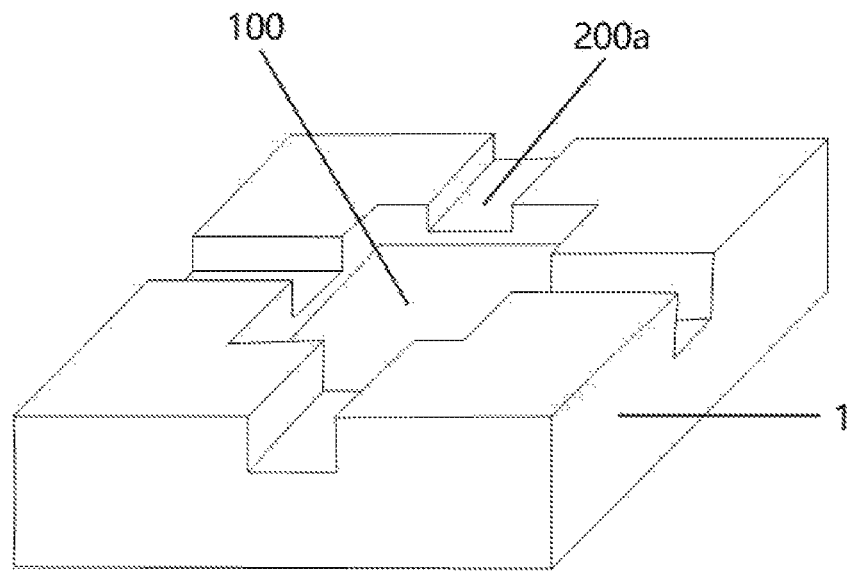
FIG. 1 is a schematic structural diagram of a pixel defining unit according to an embodiment of the present application.

The present application will now be described in detail below, and examples of embodiments of the present application will be shown in the drawings throughout which, the same or similar reference signs refer to the same or similar components or components with the same or similar functions. In addition, a detailed description of the known art is omitted if it is unnecessary for the shown features of the present application. The embodiments described below with reference to the drawings are merely illustrative, and are used only for the purpose of explaining the present application and should not be interpreted as limitations to the present application.

It will be understood by those skilled in the art that unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the prior art and will not be interpreted in an idealized or overly formal sense unless expressly so defined herein.

Those skilled in the art will understand that as used herein, the singular forms "a", "an", "the" and "said" are intended to include the plural forms as well, unless expressly stated otherwise. It will be further understood that as used herein, the terms "comprises" and/or "comprising" specify the presence of stated features and/or components, but do not preclude the presence or addition of one or more other features, components, and/or groups thereof. As used herein, the term "and/or" includes all or any element and all combinations of one or more of the associated listed items.

A flexible display screen typically includes a pixel including plurality of sub-pixels arranged in an array, a pixel defining structure configured to carry all the sub-pixels, and a Thin-Film Encapsulation (TFE) configured to encapsulate a combination of the pixel and the pixel defining structure. In a flexible display screen with the above structure, the TFE typically has a preset thickness, e.g., 10 to 20 micrometer (μm), which takes a relatively large proportion in the overall thickness of the flexible display screen, and the thickest organic encapsulation layer in the TFE, which is typically even thicker, may have a thickness up to 4 to 16 μm. Reducing thickness is difficult in the encapsulation operation because it needs to first ensure that a liquid membrane material used to form the TFE spreads and levels sufficiently over the combination of the pixel and the pixel defining structure. In addition to properties of the liquid membrane material of TFE, the spreading and levelling effects of the liquid membrane material are further closely related to structural conditions of openings (each opening is configured to carry a corresponding sub-pixel) in the pixel defining structure. Due to the blocking effect on the liquid membrane material of the openings in the pixel defining structure, in the encapsulation operation, before levelling on the surface of the pixel defining structure, the liquid membrane material usually needs to cover the overall pixel defining structure (i.e., the liquid membrane material needs to overflow above the openings in the pixel defining structure). Therefore, a large amount of liquid membrane material is needed to guarantee the levelling effect, resulting in an increased thickness of the final TFE layer, thereby deviating from the object of reducing thickness of the overall device and further away from a lightweight product The inventor of the present application has studied and found that, in the structure of the flexible display screen, the thickness of TFE accounts for a relatively large proportion in the overall thickness of the flexible display screen, but Reducing thickness is difficult in the encapsulation operation because it needs to first ensure that a liquid membrane material used to form the TFE spreads and levels sufficiently aver the combination of the pixel and the pixel defining structure, and before levelling on the surface of the pixel defining structure, the liquid membrane material usually needs to cover the overall pixel defining structure (i.e., the liquid membrane material needs to overflow above the openings in the pixel defining structure). Therefore, a large amount of liquid membrane material is needed to guarantee the levelling effect, resulting in an increased thickness of the final TFE layer.

The present application provides a pixel defining unit, a pixel defining structure, a display structure and a display device that aim to solve the above technical problems in the prior art.

The following describes the technical solution of the present application and how to solve the above technical problems in detail by specific embodiments.

In an embodiment of the present application, there is provided a pixel defining unit 1. A schematic structural diagram of the pixel defining unit 1 is shown in FIG. 1. The pixel defining unit 1 includes a pixel hole 100 for arranging a sub-pixel, and a first guide groove section 200a in communication with the pixel hole 100 and extending outward of the pixel defining unit 1.

The pixel hole 100 in the pixel defining unit 1 is configured to carry a corresponding sub-pixel of the pixel, and the pixel defining unit 1 ensures that the carried sub-pixel is separated from and does not cross color with other sub-pixels of the pixel.

The first guide groove section 200a in the pixel defining unit 1, which is configured to communicate with the pixel hole 100 and extend outward of the pixel defining unit 1, may be connected to a corresponding guide groove section in another pixel defining unit 1 (e.g. an adjacent pixel defining unit 1), or directly connected to the pixel hole 100 in another pixel defining unit 1. Therefore, the encapsulation operation can happen only in the pixel hole 100 and the first guide groove section 200a, which ensures that the levelling height is reduced under the premise that the liquid membrane material forming the TFE is sufficiently spread and levelled, thereby reducing the thickness of the TFE and thus the flexible display screen, and facilitating bending of the flexible display screen (e.g., a flexible OLED product) in a smaller radius and implementation of more flexible product forms. Further, levelling of the liquid membrane material is guided with the first guide groove section 200a so that the liquid membrane material does not need to wholly submerge (cover) the pixel defining unit 1 to implement the levelling action, and the levelling action happens earlier with a more definite levelling direction, thereby improving the levelling efficiency while reducing consumption of the liquid membrane material and thus the cost, and further facilitating the thickness reduction of the overall TFE and bending of the flexible display screen.

Optionally, a manufacturing process of the pixel defining unit 1 sequentially includes: gluing, exposing, developing, etching and so on. Since the first guide groove section 200a has a shallower opening than the pixel hole 100, the pixel defining unit 1 may be exposed twice to be manufactured. A first exposure forms a shallower first guide groove section 200a area, and a second exposure forms a deeper pixel hole 100 area, so as to obtain the pixel defining unit 1 as described above. Apparently, the structure of the pixel defining unit 1 may also be formed by one exposure and gradient exposure through a process such as halftone mask, gray tone mask, etc.

The inventor of the present application considers that the size of the first guide groove section 200a has a large influence on the performance of the entire pixel defining unit 1. If the size is too small, on one hand, processing will become more difficult (after all, only micron-sized), and on the other hand, the cost of material selection and use of TFE, will be increased, and a liquid membrane material with better fluidity is required to enter the first guide groove section 200a. However, if the size is too large, on one hand, the levelling area will be increased, that is, the consumption of the liquid membrane material will be increased, thereby reducing the levelling efficiency and increasing the cost of material use, and on the other hand, the placement of sub-pixels in the pixel hole 100 of the pixel defining unit 1, or the levelling efficiency of the liquid membrane material, or the like, will be influenced. In view of this, the present application provides a possible implementation for the first guide groove section 200a as follows:

the first guide groove section 200a has a depth not less than ⅕ and not greater than ⅘ of a depth of the pixel hole 100;

and/or, the first guide groove section 200a has a width not less than ⅓ and not greater than ½ of a width of the pixel hole 100 at an upper opening.

The first guide groove section 200a with the above depth is easy to manufacture and suitable for more types of liquid membrane materials, and can ensure placement of the sub-pixels in the pixel hole 100 of the pixel defining unit 1.

The first guide groove section 200a with the above width is easy to manufacture and suitable for more liquid membrane materials used to form the TFE, and can reduce consumption of the material as well as the cost under the premise of ensuring sufficient and effective levelling of the liquid membrane material.

The inventor of the present application considers that when the combination of the pixel and the pixel defining unit 1 is encapsulated, the liquid membrane material needs to be in sufficient contact with the combination, and bubbles or air cavities that may cause uneven encapsulation should be avoided during the encapsulation operation. In view of this, the present application provides a possible implementation for the pixel hole 100 as follows:

an angle formed between a hole wall of the pixel hole 100 and the upper opening of the pixel hole 100 is not greater than 90°.

Figure 4:
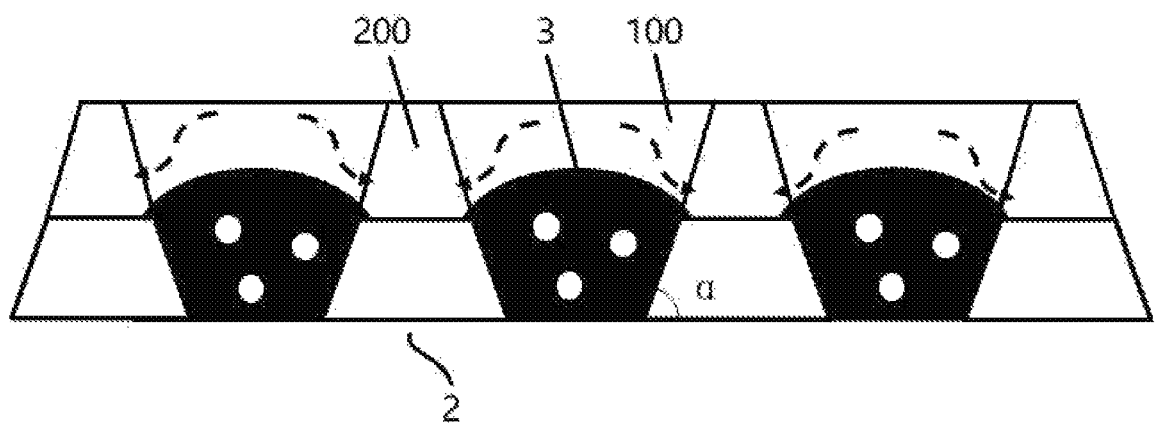
FIG. 4 is a sectional diagram along A-A in FIG. 2 of a pixel defining structure according to an embodiment of the present application in a levelled state.

That is, the pixel hole 100 has a shape in which the hole diameter decreases from top to bottom, so as to reduce the possibility of forming an air cavity between the liquid membrane material and the hole wall of the pixel hole 100 after the liquid membrane material enters the pixel hole 100, thereby facilitating a uniform encapsulation. Reference may be made to FIG. 4, wherein for the sake of convenience, an alternate interior angle α of the "angle formed between the hole wall of the pixel hole 100 and the upper opening of the pixel hole 100" is labelled in FIG. 4.

Optionally, the pixel hole 100 has an axial section with a rectangular, inverted trapezoid, inverted triangular or arched shape.

Obviously, the pixel hole 100 may also adopt other special-shaped structures to satisfy the requirement that the hole diameter gradually increases from bottom to top.

Figure 2:
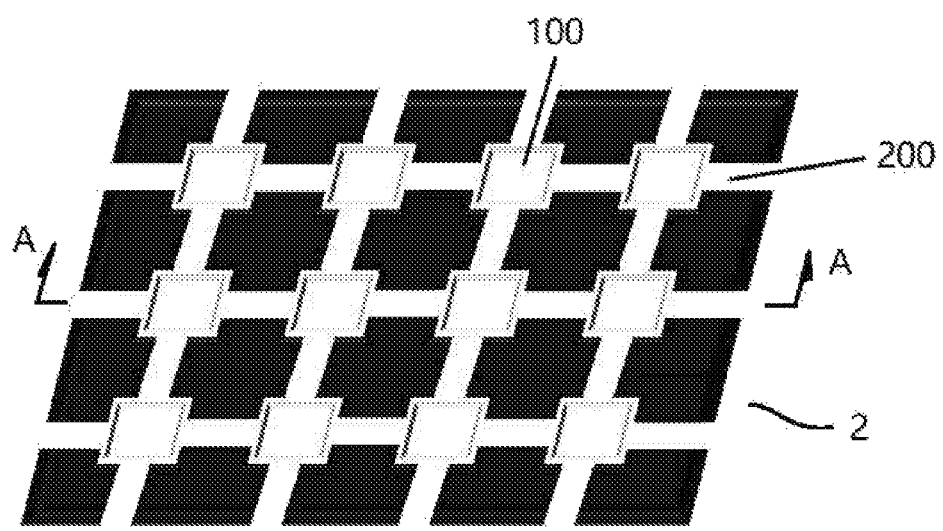
FIG. 2 is a schematic structural diagram illustrating a first implementation of a pixel defining structure according to an embodiment of the present application.

Based on the same inventive concept, in an embodiment of the present application, there is provided a pixel defining structure 2. A schematic structural diagram of the pixel defining structure 2 is shown in FIG. 2. The pixel defining structure 2 includes at least two pixel defining units 1 as described in any of the above embodiments arranged in an array, and first guide groove sections 200a corresponding to two adjacent pixel defining units 1 are communicated with each other to form a first guide groove 200. Here, the "corresponding first guide groove sections" refer to the first guide groove sections of two adjacent pixel defining units that are opposite to each other.

The pixel defining structure 2 may be formed by splicing a plurality of pixel defining units 1 of any one of the embodiments, or may be integrally formed.

The pixel defining structure 2 is improved by making first guide groove sections 200a corresponding adjacent pixel defining units 1 communicate with each other to form the first guide groove 200 so that the first guide groove 200 communicates the pixel holes 100 of two adjacent pixel defining units 1. Therefore, the encapsulation operation can happen only in the pixel hole 100 and the first guide groove 200, which ensures that the levelling height is reduced under the premise that the liquid membrane material forming the TFE is sufficiently spread and levelled, thereby reducing the thickness of the TFE and thus the flexible display screen, Further, levelling of the liquid membrane material is guided with the first guide groove 200 so that the levelling direction is clear and definite, thereby improving the levelling efficiency and reducing consumption of the liquid membrane material and thus the cost.

Figure 3:
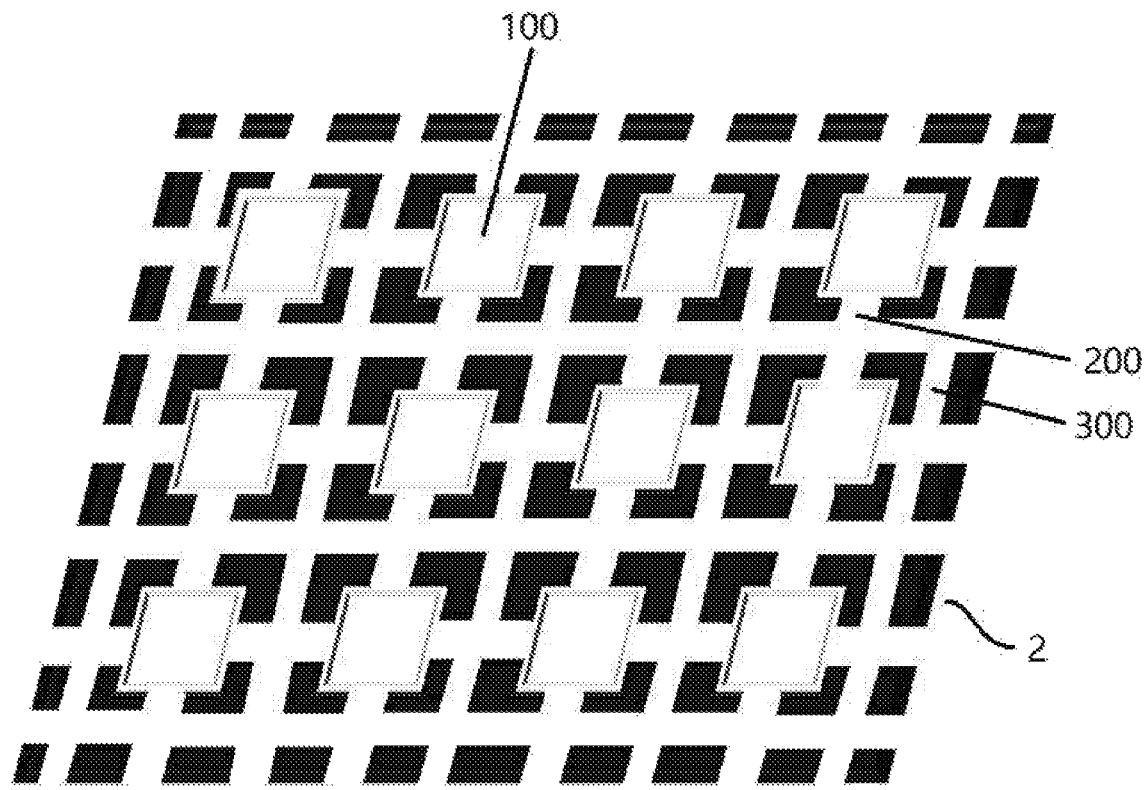
FIG. 3 is a schematic structural diagram illustrating a second implementation of a pixel defining structure according to an embodiment of the present application.

The inventor of the present application considers that the liquid membrane material is usually sprayed as liquid drops in the pixel holes 100 of the pixel defining structure 2 during encapsulation operation, it is difficult to ensure absolute uniformity in actual production, and if a too large difference occurs in the amount of the liquid membrane material, a higher levelling requirement will be set for the pixel defining structure 2. Since the first guide groove 200 is in direct communication with the pixel hole 100 and more levelling opportunities are provided for the liquid membrane material, the most direct way may be realizing by increasing the number of the first guide grooves 200. However, also because the first guide groove 200 is in direct communication with the pixel hole 100, the increase in the number of the first guide grooves 200 will inevitably bring about a negative effect of crosstalk between adjacent sub-pixels. In view of this, the present application provides a possible implementation of the pixel defining structure 2 as follows:

As shown in FIG. 3, the pixel defining structure 2 further includes a plurality of second guide grooves 300, each of which is separated from the pixel hole 100 and communicates two adjacent first guide grooves 200. Here, "separated from" means not directly connected, that is, the second guide groove 300 is not in direct communication with the pixel hole 100.

The pixel defining structure 2 is further improved by adding the second guide grooves 300 to communicate two adjacent first guide grooves 200 so that more directions, i.e., more levelling opportunities, are provided for the levelling, thereby reducing the levelling time and improving the levelling efficiency. Meanwhile, the second guide groove 300 not in direct communication with the pixel hole 100 will not cause crosstalk of adjacent sub-pixels.

Figure 5:
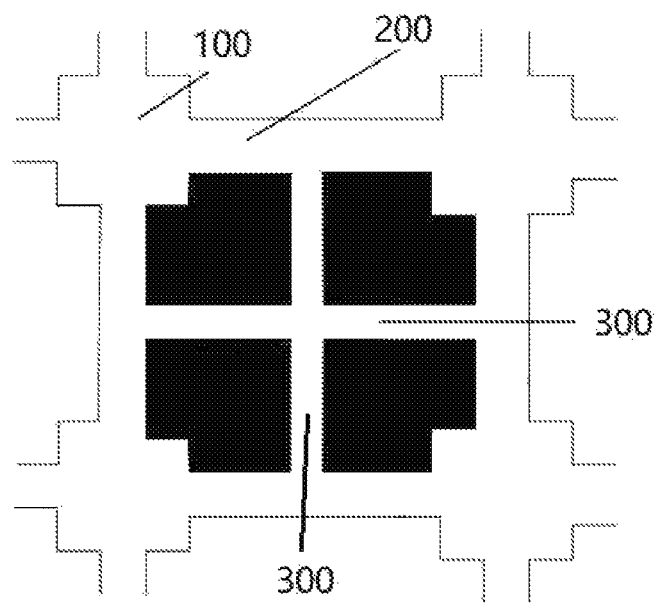
FIG. 5 is a schematic structural diagram illustrating a first implementation of an array unit in a pixel defining structure according to an embodiment of the present application.

The inventor of the present application considers that when more than two pixel defining units 1 are arranged in an array in the pixel defining structure 2, the respective pixel hole 100 may enclose a certain closed region with the corresponding first guide grooves 200 in communication with the pixel holes 100. For example, three pixel holes 100 arranged in a non-collinear manner may enclose a triangular closed region with the corresponding first guide grooves 200, four pixel holes 100 arranged in a non-collinear manner may enclose a quadrangular closed region with the corresponding first guide grooves 200, so on and so forth. The second guide groove 300 is often disposed in the closed region, and more than one second guide grooves 300 may be provided there. If the second guide grooves 300 are communicated, further more levelling directions and opportunities can be provided for levelling of the liquid membrane material. In view of this, the present application provides a possible implementation for the second guide groove 300 as follows:

As shown in FIG. 5, at least two of the second guide grooves 300 are provided in the same array unit, and at least two of the second guide grooves 300 are mutually crossed and communicated.

The array unit here is a closed region enclosed by the pixel holes 100 of at least three adjacent pixel defining units 1 and the first guide grooves 200 corresponding to the pixel holes 100.

Optionally, the pixel holes 100 of every three adjacent pixel defining units 1 and the corresponding first guide grooves 200 enclose an array unit. In this case, two or three second guide grooves 300 that are mutually crossed and communicated may be arranged in the array unit. For example, one second guide groove 300 may be connected between two adjacent first guide grooves 200 that are communicated with the respective pixel holes 100.

Optionally, the pixel holes 100 of every four adjacent pixel defining units 1 and the corresponding first guide grooves 200 enclose an array unit. In this case, two to six second guide grooves 300 that are mutually crossed and communicated may be arranged in the array unit. For example, one second guide groove 300 may be connected between two adjacent first guide grooves 200 that are communicated with each of the pixel holes 100, and one second guide groove 300 may be connected between each pair of opposite first guide grooves 200.

By analogy, further combinations are not described herein.

Figure 6:
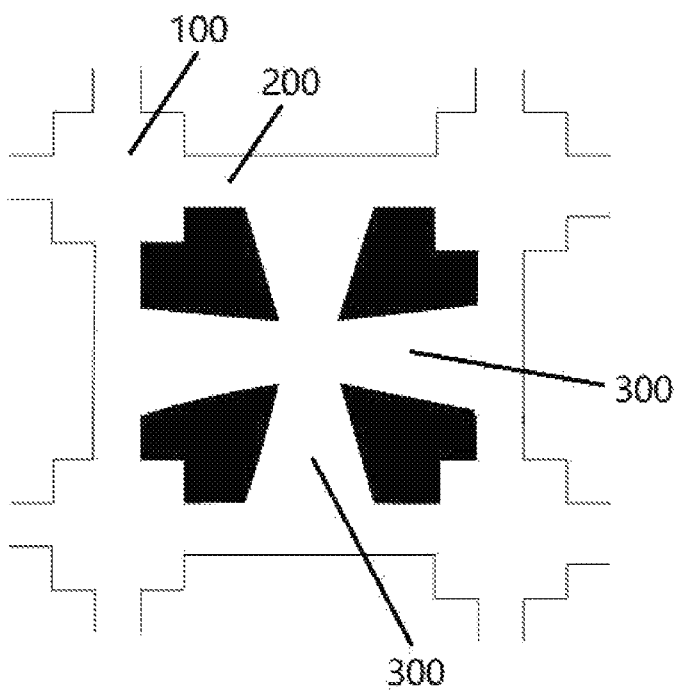
FIG. 6 is a schematic structural diagram illustrating a second implementation of an array unit in a pixel defining structure according to an embodiment of the present application.

The inventor of the present application considers that the liquid membrane material is usually sprayed as liquid drops in the pixel holes 100 of the pixel defining structure 2 during encapsulation operation, that is, during levelling, the liquid membrane material flows from the pixel hole 100 to the surrounding first guide grooves 200, and then enters the second guide groove 300 (for convenience of description, it is defined herein that an end of the first guide groove 200 or the second guide groove 300 closer to the pixel hole 100 is a levelling starting end of the corresponding guide groove, and a portion or end of the first guide groove 200 or the second guide groove 300 away from the pixel hole 100 is a levelling ending portion or end of the corresponding guide groove). As a result, the levelling starting end has the maximum flow rate, and if this part of flow path has an insufficient size, the flow will be obstructed. In contrast, the levelling ending end has a lower flow rate or a flow rate close to zero, and if this part of flow path has a too large size, the levelling operation amount will be increased, the levelling efficiency will be reduced, and the consumption of the liquid membrane material will be increased. In view of this, the present application provides a possible implementation for the second guide groove 300 as follows:

As shown in FIG. 6, for either of the two second guide grooves 300 crossed and communicated with each other, a first opening at a communication point with the first guide groove 200 is larger than a second opening at a cross and communication point with the other second guide groove 300, and a cross section of the second guide groove 300 perpendicular to the pixel hole 100 gradually tapers from the first opening to the second opening.

The second guide groove 300 with the above structure can meet the relatively high demand on flow rate at the levelling starting end, and the tapering cross section of the second guide groove 300 may adapt to the levelling decreasing amplitude, improve the levelling efficiency, and saving consumption of the liquid membrane material in encapsulation operation.

Optionally, the cross section of the first guide groove 200 gradually tapers from an end portion in communication with the corresponding pixel hole 100 to a portion in communication with the second guide groove 300.

Figure 7:
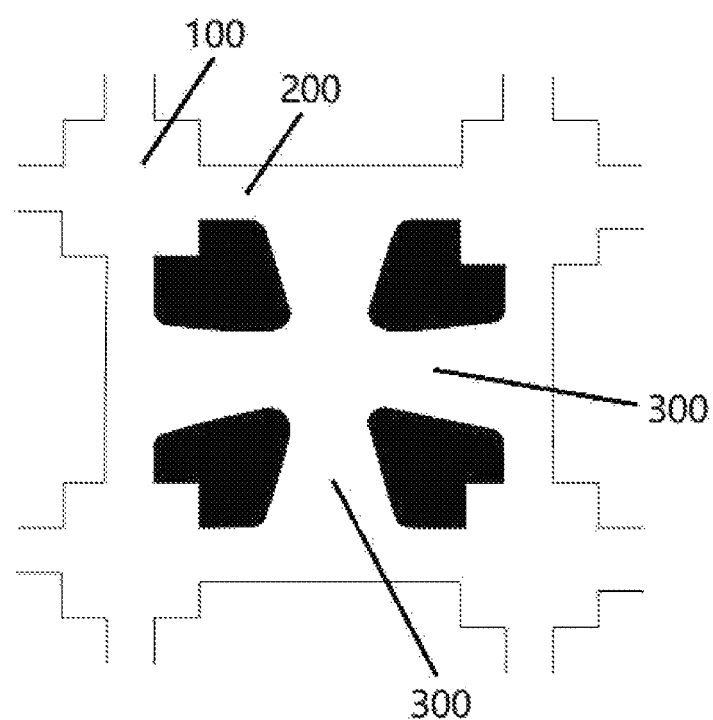
FIG. 7 is a schematic structural diagram illustrating a third implementation of an array unit in a pixel defining structure according to an embodiment of the present application.

The inventor of the present application considers that when the liquid membrane material levels from the first guide groove 200 to the second guide groove 300, changes in the direction are inevitable, and according to the principle of fluid mechanics, the structure at the communication point of the first guide groove 200 and the second guide groove 300 has an influence on the levelling efficiency. In view of this, the present application provides a possible implementation for the second guide groove 300 as follows:

As shown in FIG. 7, a chamfer is formed at the communication point of the second guide groove 300 and the first guide groove 200;

and/or, a chamfer is formed at the cross and communication point of two crossed and communicated second guide grooves 300.

Providing a chamfer at the above communication points of the second guide grooves 300 conforms to the fluid mechanics principle, reduces the resistance at the time of levelling, and ensures the levelling efficiency, Optionally, the above chamfer may include fillets.

Optionally, guide groove walls at the above two communication points of the second guide groove 300 may include a smooth transition guide groove wall connected to the chamfer, or a straight guide groove watt.

The inventor of the present application considers that the encapsulation operation must ensure that the TFE layer achieves the required encapsulation strength while controlling the material cost. In view of this, the present application provides a possible implementation for the second guide groove 300 as follows:

The second guide groove 300 has a width not less than ⅓ and not greater than ⅔ of a distance between the pixel holes 100 in two adjacent pixel defining units 1.

That is, the narrowest part of the second guide groove 300 has a width not less than ⅓ of a distance between adjacent hole walls of two adjacent pixel holes 100, and the widest part of the second guide groove 300 has a width not greater than ⅔ of the distance between the adjacent hole watts of the two adjacent pixel holes 100. With such structure, the encapsulation strength of the TFE layer can be ensured to meet the requirement white controlling consumption of the liquid membrane material and saving cost.

Based on the same inventive concept, in an embodiment of the present application, there is provided a display panel including a plurality of pixel defining units 1, each of the plurality of pixel defining units 1 has a pixel hole 100 for arranging a sub-pixel, and a first guide groove section 200*a* connecting to the pixel hole, and the first guide groove sections 200*a* corresponding to two adjacent pixel defining units 1 are connected to each other to form a first guide groove 200.

Based on the same inventive concept, in an embodiment of the present application, there is provided a display device including the display panel and a thin film encapsulation layer arranged above the display panel.

Those skilled in the art will understand that various operations, methods, steps in the flow, measures, solutions discussed in this application can be alternated, modified, combined, or deleted. Further, various operations, methods, other steps in the flow, measures, solutions that have been specifically discussed in this application may be alternated, modified, rearranged, decomposed, combined, or deleted. Even further, various operations, methods, other steps in the flow, measures, solutions that have been specifically discussed in this application in the related art may be alternated, modified, rearranged, decomposed, combined, or deleted.

It will be appreciated that in the description of the present application, orientation or positional relationships referred by terms "central", "upper", "lower", "front", "back", "left", "right", "vertical", "horizontal", "top", "bottom", "inside", "outside" and the like are based on the orientation or positional relationship shown in the drawings, and are merely for facilitating description of the disclosure and simplifying the description, instead of indicting or implying that the device or component referred to must have a specific orientation or must be configured or operated at a specific orientation, and thus cannot be interpreted as limitations to the present disclosure.

The terms "first", "second" are used for the purpose of illustration only and are not to be construed as indicating or implying a relative importance or implicitly indicating the number of the indicated technical features. Therefore, features defined by "first" or "second" may include one or more of the features either explicitly or implicitly. In the description of the present disclosure, "a plurality" means two or more unless otherwise specified.

As used in the description of the present application, it is to be noted that terms "install", "connected to", and "connect" are to be understood broadly, and may refer to, for example, a fixed connection or a removable connection or an integral connection; or may refer to a direct connection, or an indirect connection via an intermedium. Those ordinary skilled in the art may understand the specific meanings of the above terms in the present disclosure according to the specific context.

In the description of the present disclosure, specific features, structures, materials or characteristics may be combined in any suitable manner in any one or more embodiments or examples. The foregoing are only part of the implementations of the present application, and it should be noted that modifications and refinements may be made by those skilled in the art without departing from the principles of the present application and these modifications and refinements should be considered as within the scope of the present application.

What is claimed is:

1. A display panel, comprising a plurality of pixel defining units, each of the plurality of pixel defining units has a pixel hole for arranging a sub-pixel, and a first guide groove section connecting to the pixel hole, and the first guide groove sections corresponding to two adjacent pixel defining units are connected to each other to form a first guide groove,
the display panel further comprising a plurality of second guide grooves, each of which is separated from the pixel hole and communicates two adjacent first guide grooves,
wherein at least two of the second guide grooves are provided in an array unit, and the at least two of the second guide grooves are mutually crossed and communicated;
the array unit is a closed region enclosed by the pixel holes of at least three adjacent pixel defining units and the first guide grooves corresponding to the pixel holes, chamfers are formed at communication points of each second guide groove and each first guide groove, and chamfers are formed at mutual cross and communication points of every two crossed and communicated second guide grooves.

2. The display panel according to claim 1, wherein the first guide groove section has a depth not less than ⅕ and not greater than ⅘ of a depth of the pixel hole.

3. The display panel according to claim 1, wherein the first guide groove section has a width not less than ⅓ and not greater than ½ of a width of the pixel hole at an upper opening.

4. The display panel according to claim 1, wherein an angle formed between a hole wall of the pixel hole and a top surface of an upper opening of the pixel hole is not greater than 90°.

5. The display panel according to claim 4, wherein the pixel hole has an axial section with a rectangular, inverted trapezoid, inverted triangular or arched shape.

6. The display panel according to claim 1, wherein for either of every two second guide grooves crossed and communicated with each other, a first opening at a communication point with the first guide groove is larger than a second opening at a cross and communication point with the other second guide groove, and a cross section of the two second guide grooves perpendicular to an opening of the pixel hole gradually tapers from the first opening to the second opening.

7. The display panel according to claim 1, wherein each second guide groove has a width not less than ⅓ of a distance between adjacent hole walls of two adjacent pixel holes, and each second guide groove has a width not greater than ⅔ of the distance between the adjacent hole walls of the two adjacent pixel holes.

8. A display device comprising the display panel according to claim 1, and a thin film encapsulation layer arranged above the display panel.

* * * * *